US008097105B2

(12) United States Patent
Shih et al.

(10) Patent No.: US 8,097,105 B2
(45) Date of Patent: Jan. 17, 2012

(54) EXTENDING LIFETIME OF YTTRIUM OXIDE AS A PLASMA CHAMBER MATERIAL

(75) Inventors: Hong Shih, Walnut, CA (US); Duane Outka, Fremont, CA (US); Shenjian Liu, Fremont, CA (US); John Daugherty, Alameda, CA (US)

(73) Assignee: Lam Research Corporation, Fremont, CA (US)

( * ) Notice: Subject to any disclaimer, the term of this patent is extended or adjusted under 35 U.S.C. 154(b) by 1009 days.

(21) Appl. No.: 11/652,048

(22) Filed: Jan. 11, 2007

(65) Prior Publication Data

US 2008/0169588 A1    Jul. 17, 2008

(51) Int. Cl.
*C03B 29/00* (2006.01)
(52) U.S. Cl. ..................... 156/89.11; 156/99
(58) Field of Classification Search ............ 156/89.11, 156/99
See application file for complete search history.

(56) References Cited

U.S. PATENT DOCUMENTS

| | | | | |
|---|---|---|---|---|
| 5,314,850 | A | * | 5/1994 | Miyahara ............... 501/98.4 |
| 5,800,871 | A | | 9/1998 | Collins et al. |
| 5,863,376 | A | * | 1/1999 | Wicker et al. ........... 156/345.38 |
| 5,908,682 | A | * | 6/1999 | Nanataki et al. ............. 428/138 |
| 5,916,689 | A | | 6/1999 | Collins et al. |
| 6,051,277 | A | * | 4/2000 | Claussen et al. ........... 427/376.3 |
| 6,351,367 | B1 | * | 2/2002 | Mogi et al. ............... 361/234 |
| 6,483,690 | B1 | * | 11/2002 | Nakajima et al. ............. 361/234 |
| 6,592,707 | B2 | | 7/2003 | Shih et al. |

(Continued)

FOREIGN PATENT DOCUMENTS

EP    1156130    11/2001

(Continued)

OTHER PUBLICATIONS

Hong Shih et al., "Extending Storage Time of Removed Plasma Chamber Components Prior to Cleaning Thereof", U.S. Appl. No. 11/239,396, filed Sep. 30, 2005.

(Continued)

*Primary Examiner* — Philip Tucker
*Assistant Examiner* — Nickolas Harm
(74) *Attorney, Agent, or Firm* — Buchanan Ingersoll & Rooney PC

(57) ABSTRACT

Two methods of extending the lifetime of yttrium oxide as a plasma chamber material are provided. One method comprises making a three-layer component of a plasma processing chamber by co-sintering a dual-layer green body where one layer comprises ceramic particles and a second layer comprises yttria particles. The two layers are in intimate contact during the sintering process. In a preferred embodiment, the three layer component comprises an outer layer of yttria, an intermediate layer of YAG, and a second outer layer of alumina. Optionally, the disks are pressed together during the sintering process. The resulting three-layer component is very low in porosity. Preferably, the porosity of any of the outer layer of yttria, the intermediate layer of YAG, and the second outer layer of alumina, is less than 3%. The second method comprises sealing an yttria plasma spray coated component by applying a liquid anaerobic sealant with a room temperature viscosity of less than 50 cP to the component by brushing the sealant on all yttria surfaces of the component, wet cleaning the component, curing the wet cleaned component for over 2 hours at a temperature of at least 150° C. in an N2 environment; and, applying a second sealant coat to the cured substrate by repeating the procedure used to apply the first coat.

11 Claims, 5 Drawing Sheets

U.S. PATENT DOCUMENTS

| | | |
|---|---|---|
| 6,789,498 B2 | 9/2004 | Kaushal et al. |
| 6,798,519 B2 | 9/2004 | Nishimoto et al. |
| 6,916,559 B2 | 7/2005 | Murakawa et al. |
| 2001/0003271 A1 | 6/2001 | Otsuki |
| 2002/0086118 A1 | 7/2002 | Chang et al. |
| 2003/0159657 A1 | 8/2003 | Kaushal et al. |
| 2003/0165043 A1 | 9/2003 | Logan et al. |
| 2004/0002221 A1 | 1/2004 | O'Donnell et al. |
| 2004/0033385 A1 | 2/2004 | Kaushal et al. |
| 2004/0173155 A1 | 9/2004 | Nishimoto et al. |
| 2004/0191545 A1 | 9/2004 | Han et al. |
| 2004/0224125 A1* | 11/2004 | Yamada et al. ............ 428/131 |
| 2005/0136188 A1* | 6/2005 | Chang .................... 427/421.1 |
| 2006/0073349 A1* | 4/2006 | Aihara et al. ............ 428/469 |
| 2006/0196762 A1* | 9/2006 | Miki et al. ............... 204/157.3 |
| 2006/0222862 A1* | 10/2006 | Akedo et al. ............. 428/426 |
| 2006/0234100 A1* | 10/2006 | Day et al. .................. 429/33 |

FOREIGN PATENT DOCUMENTS

| | | |
|---|---|---|
| WO | WO2005029553 | 3/2005 |

OTHER PUBLICATIONS

International Search Report and Written Opinion for PCT/US2008/000018 dated May 26, 2008.

Official Action dated May 31, 2010 for Chinese Patent Appln. No. 200880002182.9.

\* cited by examiner

EXTENDING LIFETIME OF YTTRIUM OXIDE AS A PLASMA CHAMBER MATERIAL

BACKGROUND

In the field of semiconductor material processing, various types of equipment exist for semiconductor processing applications, including applications that involve the use of plasmas such as plasma etch, plasma-enhanced chemical vapor deposition (PECVD) and resist strip. The types of equipment required for these processes include components which are used within the plasma chamber and must operate in that environment. The environment inside the plasma chamber may include exposure to the plasma, exposure to etchant gasses, and thermal cycling. Due to the corrosive nature of the process gases and plasma in such processing chambers, and the desire to minimize particle and/or metal contamination of substrates processed in the chambers, it is desirable that plasma-exposed components of such equipment are erosion and corrosion resistant to such gases and to the plasma. In some process chamber environments, for example, halogen containing high-density plasma-etching chamber environments, conditions are highly aggressive, causing erosion of various chamber components, including chamber walls, liners, process kits and dielectric windows. This is particularly true of high-density fluorine-containing plasma-etching environments, which are frequently used in connection with dielectric etching processes.

SUMMARY

A method of making a three-layer component of a plasma processing chamber is provided. The method comprises co-sintering a dual-layer green body where one layer comprises alumina particles and a second layer comprises yttria particles. The two layers are in intimate contact during the sintering process. In a preferred embodiment, the three layer component comprises an outer layer of yttria, an intermediate layer of YAG, and a second outer layer of alumina. Optionally, the two layers are pressed together during the sintering process.

The resulting three-layer component is very low in porosity. Preferably, the porosity of any of the outer layer of yttria, the intermediate layer of YAG, and the second outer layer of alumina, is less than 3%. In embodiments, the component is a dielectric window, a chamber wall, a chamber liner, a substrate support, a baffle, a gas distribution plate, a plasma confinement ring, a nozzle, a fastener, a heating element, a plasma focus ring, or a chuck.

A method of sealing an yttria plasma spray coated component of a plasma processing chamber is also provided. The method comprises applying a liquid anaerobic sealant with a room temperature viscosity of less than 50 cP to the component by brushing the sealant on all yttria surfaces of the component, wet cleaning the component, curing the wet cleaned component for over 2 hours at a temperature of at least 150° C. in an $N_2$ environment; and, applying a second sealant coat to the cured substrate by repeating the procedure used to apply the first coat.

DETAILED DESCRIPTION

Plasma processing apparatuses for semiconductor substrates, such as silicon wafers, include plasma etch chambers which are used in semiconductor device manufacturing processes to etch such materials as semiconductors, metals and dielectrics. For example, a conductor etch chamber might be used to etch materials such as aluminum or silicon. Typical gasses used in conductor etch processes include $CF_4$ and $SF_6$, which can have a corrosive effect on plasma chamber components. Due to the advanced properties and excellent performance of yttria ($Y_2O_3$) on plasma etching equipment, yttria has been widely used as a surface coating in semiconductor etch equipment. Plasma chamber components with yttria coatings have shown demonstrated improved plasma resistance under both Cl-based and F-based high density plasmas. For metal etch applications, yttria coated surfaces have reportedly shown ten times the durability in a plasma environment than high purity ceramic alumina alone. In poly etch applications, yttria can serve as a non-consumable chamber material. The use of yttria also avoids the formation of $AlF_3$, which is a potential particle source for conductor etch applications.

Figure 1:
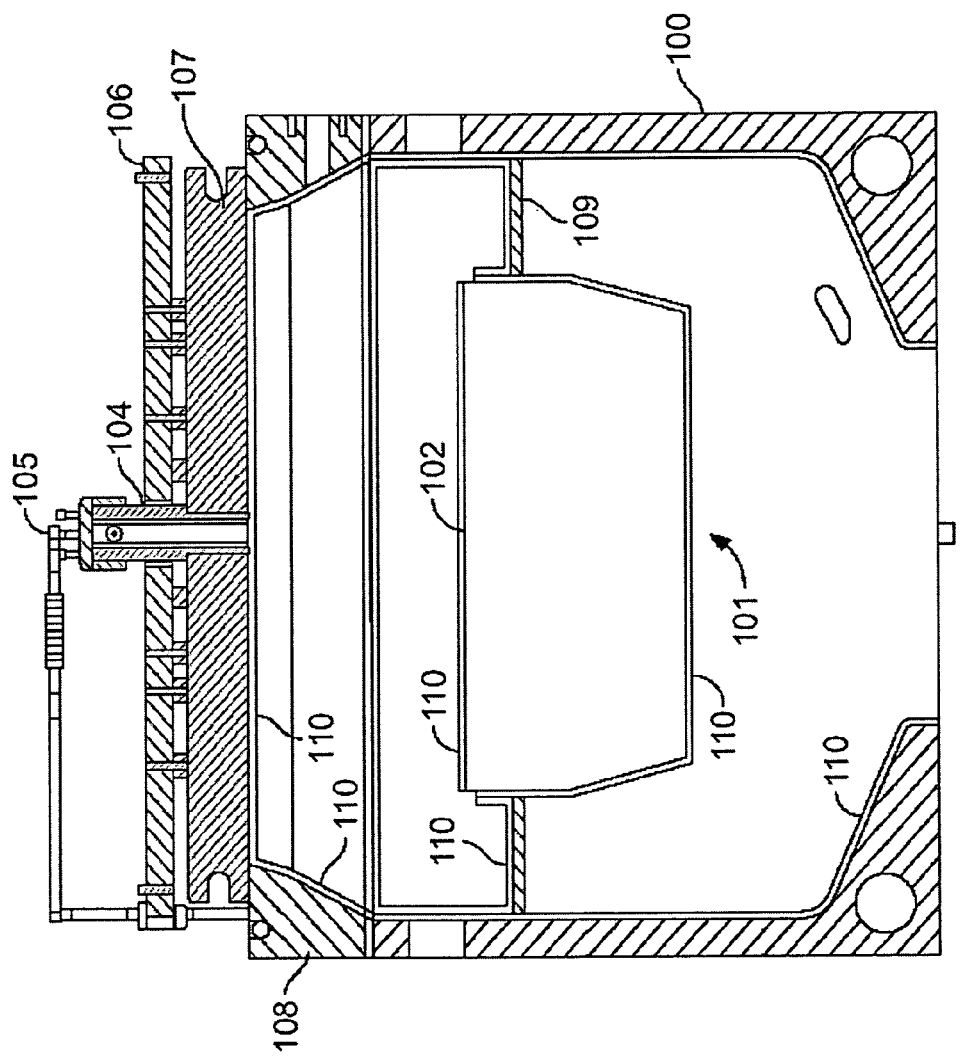
FIG. 1 shows a schematic of the Versys 2300™, an exemplary plasma reactor that can include components with thermal spray coatings such as yttria coatings.

Yttria used as a chamber material can be applied as a plasma spray coating on either anodized aluminum or high-purity alumina components, such as chamber liners and dielectric windows. An exemplary plasma reactor that can include components with thermal spray coatings such as yttria coatings is the Versys 2300™ etcher available from Lam Research Corporation (Fremont, Calif.), and is schematically shown in FIG. 1. The reactor comprises a reactor chamber 100 that includes a substrate support 101 including an electrostatic chuck 102, which provides a clamping force to a substrate such as a semiconductor wafer (not shown) mounted thereon. The substrate support 101 is typically made of anodized aluminum and can also be used to apply an RF bias to the substrate. The substrate can also be back-cooled using a heat transfer gas such as helium. Processing gases are introduced into the chamber 100 via a gas injector 104 located on the top of chamber 100 and connected to a gas feed 105. The gas injector 104 is typically made of quartz or a ceramic material such as alumina. As shown, an inductive coil 106 can be powered by a suitable RF source (not shown) to provide a high density plasma. The inductive coil 106 couples RF energy through dielectric window 107 into the interior of chamber 100. The window 107 is typically made of a dielectric material such as quartz or alumina. The window 107 is shown mounted on an annular member 108, typically made of anodized aluminum. The annular member 108 spaces window 107 from the top of chamber 100. A baffle screen 109, typically made of anodized aluminum surrounds the substrate support 101. The chamber 100 can also include suitable vacuum pumping apparatus (not shown) for maintaining the interior of the chamber at a desired pressure.

In FIG. 1, selected internal surfaces of reactor components, such as the annular member 108, dielectric window 107, substrate support 101, chamber liner 109, gas injector 104 and the electrostatic chuck 102, are shown coated with a thermal sprayed coating such as an yttria coating 110. As shown in FIG. 1, selected interior surfaces of the chamber 100 and substrate support 101 below the chamber liner 109 can also be provided with a thermal sprayed coating such as an yttria coating 110. Any or all of these surfaces, as well as any other internal reactor surface, can be provided with a thermal sprayed coating such an yttria coating.

However, while a thermal sprayed yttria coating has low porosity, usually about 5%, and can protect the underlying material of the component from the effects of the plasma, the coating can lack sufficient integrity to prevent penetration of certain reactants. This is because a common feature of all thermal spray coatings is their lenticular or lamellar grain structure resulting from the rapid solidification of small globules, flattened from striking a cold surface at high velocities. While this creates a substantially strong covering in which mechanical interlocking and diffusion bonding occur, it can also create small voids, pores, micro-fractures and regions incomplete bonding within the yttria coating. A poor yttria coating, for example, may have an open volume of 15%. This means that it can potentially allow chemicals to penetrate to the anodized aluminum substrate.

Plasma spray coated yttria has been observed to peel from both anodized and ceramic surfaces after use in a plasma chamber. These failures have reduced the lifetime of yttria as an advanced chamber material and contributed to an increase in cost. Not wishing to be bound by theory, four possible root causes of yttria coating failures have been examined. It is to be understood that these models are for explanatory purposes only and additional models may exist:

1. For components such as those used in aluminum etch chambers, or components having anodized layers, by-products, which can be observed on used etch components, can react with moisture in atmospheric air to form an acid. $AlCl_3$, a metal etch by-product, for example, can react with $H_2O$ to form hydrochloric acid, HCl. A possible reaction is:

$$2AlCl_3 + 3H_2O = 2Al(OH)_3 + 6HCl \qquad (1)$$

Because yttria can have about 5% porosity by volume, the formed HCl can then penetrate the yttria layer through the pores, to reach either the yttria/anodization layer interface, or the yttria/ceramic interface, in the case of an anodized substrate or a ceramic substrate, respectively. HCl will attack yttria at the interface, resulting in reduced bonding strength.

In the case of an anodized aluminum substrate, HCl can also reach the aluminum through micro-cracks in the anodized layer, resulting in a chemical reaction which generates hydrogen gas ($H_2$), a potential cause of delamination of the yttria coating. A possible reaction is:

$$6HCl + 2Al = 2AlCl_3 + 3H_2 \qquad (2)$$

Additionally, the created aluminum chloride, may again react with moisture to form additional hydrochloric acid, starting the process again. As sufficient hydrogen gas is produced beneath the anodized aluminum layer, a gas pocket is formed. When sufficient pressure is built up, substantial damage can be done to the layers above it. That is, a blister may be formed that eventually causes the anodized aluminum and yttria layers to flake off or peel. Procedures to prevent the formation of HCl on yttria surfaces have been described in commonly owned U.S. application entitled "Extending Storage Time Of Removed Plasma Chamber Components Prior To Cleaning Thereof", Ser. No. 11/239,396, filed Sep. 30, 2005, hereby incorporated in its entirety for reference.

2. Subsequent to precision wet cleaning of an yttria-coated part, if the yttria coating is not fully baked, incomplete water moisture removal can result. In this event, during a subsequent metal etch process, $Cl_2$ can then react with the residual water moisture to form HCl. This reaction generates heat and HCl under the coating, and can create many tiny blisters and delamination of the yttria coating surface.

3. Plasma spray coating results in a physical bond with the target surface. Bead blasting is used to roughen the target anodized or ceramic surface, which enhances the bonding strength between the yttria coating and the substrate. Variations in the bead blasting process due to uneven quality control, as well as the surface cleanliness of the target substrate before plasma spray coating can also impact the bonding strength. Therefore, quality control of component fabrication can impact the lifetime of yttria plasma spray coating.

4. During wet cleaning, the use of a high ultrasonic power density or a high pressure water flush can promote peeling. After wet cleaning, techniques to dry the component surface such as a high pressure air stream or extensive acid wiping may also cause the yttria coating to peel off.

Regardless of mechanism, peeling of a surface layer has been observed in the presence of etch by-products. In light of the above-described disadvantages associated with using yttria-coated components in plasma processing chambers, further investigations have been conducted to develop components comprising different, more suitable, materials. As a result of these investigations, it has been discovered that components comprising alternative fabrication techniques can be used without the above-mentioned disadvantages. According to a preferred embodiment, components comprising co-sintered alumina and yttria provide superior protection against peeling of the yttria protective layer.

Taken by itself, yttria has low mechanical strength. For example, yttria has a bending strength of 140 MPa and fracture toughness of 1.2 MPa m$^{1/2}$, the values of both of which would be considered insufficient for the fabrication of a dielectric window. While some sintered high purity yttria has been fabricated as a solid material into chamber components such as edge rings, focus rings and liners, such components may not be as strong as desired and can be expensive. Advantageously, a thin layer of high purity yttria can provide the advantages offered by yttria described above. A layer of yttria may be applied to a high purity alumina window, which has preferred mechanical properties to yttria. For example, alumina has a bending strength of 350 MPa and fracture toughness of 4.5 MPa m$^{1/2}$, factors of nominally 2.5 and 3.75 times the corresponding values for yttria. According to a preferred embodiment, the use of high purity (99.7%) alumina as the base material of a dielectric window for RF coupling meets the requirements of adequate mechanical property of dielectric window.

The following detailed example describes a co-sintering process applied for fabrication of dielectric window component such as 107. It is intended to be illustrative rather than exclusionary:

EXAMPLE 1

Manufacture of a ceramic window in accordance with a preferred embodiment comprises the following steps:

An alumina powder is machine mixed together with a polymeric binder to form a green body. An yttria powder and binder are similarly mixed to form a second green body. Each body is formed into a planar disk with a smooth surface and a diameter of at least the desired final diameter. The disks are then formed into a two-layer structure of high purity alumina of thickness approximately 33 mm, and high purity yttria, of thickness approximately 5 mm. The dual-layer structure is pressed together as part of a forming step in preparation for green body machining. The structure may be pressed together isostatically, or unidirectionally, along the central axis of the disks. In this example the total thickness of the ceramic window is about 1.5 inches, the desired target thickness of a dielectric window.

The dual-layer structure is then dried using a drying process such as a hot plate, at a temperature of about 100-200° C., and is still a green body. At this point, pressure is removed, and the green body can be machined to form the desired shape. The body is then annealed in a kiln, in an environment of atmospheric air. Alternatively, an annealing gas such as $H_2$ or $N_2$ could be used instead of atmospheric air. Because of the relatively low thermal shock resistance of ceramic materials, a slow temperature ramp is used. A ramp-up time of at least about 1 full day (24 hours) can be used, to achieve a sintering temperature of about 1600° C. The sintering temperature is maintained for at least about 5 days (120 hours), before a slow temperature ramp-down is carried out. The ramp-down time is preferably comparable to the ramp-up time, at least about 1 day (24 hours).

Optionally, the isostatic or unidirectional pressure can also be applied during the sintering process to promote more consistent processing results. In this event, the sintering process is sometimes referred to as a "HIP" process, an acronym for High Isothermal Pressure.

After the anneal, the body can then be mechanically grinded and/or lapped, in order to achieve the desired surface finish. Additionally, an inspection is performed in which a check for cracks, abrasions or asperities is carried out, along with a check of dimensions. After the inspection, the body is brought into a class 100 cleanroom where it is cleaned from metal contamination. A cleaning procedure is summarized in the following sequence:
1. De-ionized (DI) water rinse for 5 minutes
2. Wipe part with clean room wipe
3. Blow dry part with filtered clean dry air (CDA)
4. Wipe with isopropyl alcohol for 20-30 minutes
5. Soak part in acetone for 10 minutes, followed by a wipe and rinse with DI water
6. Blow dry part with filtered CDA
7. Place part in solution of ammonia (29%), hydrogen peroxide (30%), and water in a ratio of (1:1:2 to 1:1:5) by volume, for 30 minutes at room temperature.
8. DI rinse for 5 minutes
9. Place part in solution of nitric acid, HF, water in a ratio of (1:1:10) by volume
10. Wipe surface for 2 minutes
11. DI water rinse for 5-10 minutes
12. DI ultrasonic for 1 hour at room temperature
13. Blow dry using filtered CDA
14. Bake in oven for 2 hours at 120° C.

After the oven bake, the body is inspected for surface particles, using, for example, an inspection tool such as the QIII+ Surface Particle Detector from Pentagon Technologies, Hayward, Calif. Using a threshold setting for particle detection of 3 microns, the final reading is preferably a count of zero, or a count of 3 particles or less. The body is then usable as a chamber component, and is packaged while still in the class 100 cleanroom.

During the sintering process, the dual-layer structure will form a three layer structure comprising a solid solution of yttria and alumina. This solid solution is preferably in the form of yttrium-aluminum garnet (YAG), having the chemical formula $Y_3Al_5O_{12}$, a crystalline compound of the garnet group. The formation of YAG as the intermediate layer will result in a three-layer structure comprising layers consisting of a high purity alumina, YAG (alumina and yttria solid solution), and high purity yttria. In an exemplary embodiment, a starting thickness of the yttria of 5 mm and a starting thickness of the alumina of 33 mm results in a final thickness of the yttria layer of about 3 mm, a final thickness of the YAG layer of about 4 mm and a final thickness of the alumina layer of about 31 mm. That is, during the anneal, about 2 mm each of yttria and alumina are consumed to form an approximately 4 mm thick layer of YAG.

Figure 2B:
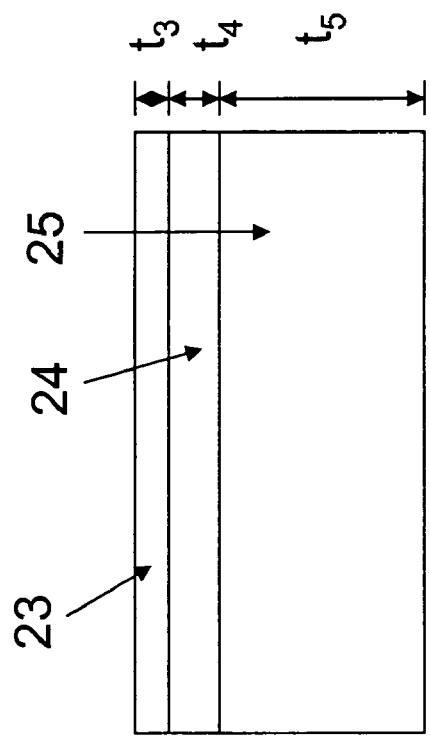
FIG. 2a shows a composite of alumina and yttria prior to sintering and FIG. 2b shows the composite after sintering.
Figure 2A:
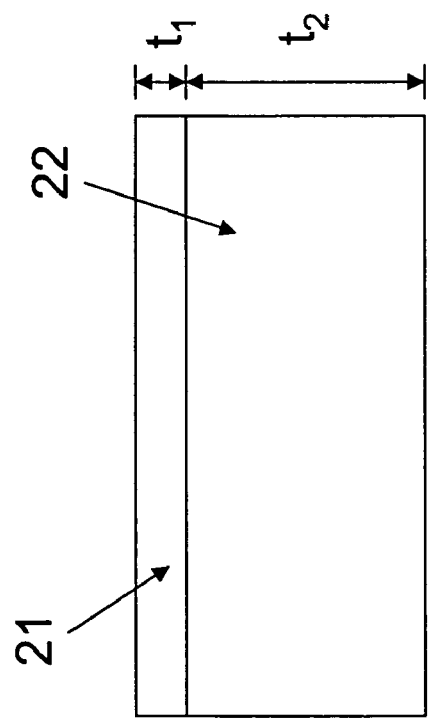

An exemplary representation of the results of the sintering process on layer thickness can be seen in FIGS. 2*a* and 2*b*. FIG. 2*a* shows the dual-layer yttria alumina structure comprising yttria layer 21, where $t_1$ is 5 mm, and alumina layer 22, where $t_2$ is 33 mm. The three-layer structure formed after sintering is shown in FIG. 2*b*, and comprises yttria layer 23 and alumina layer 25. It can also be seen that an intermediate layer of YAG 24 has been formed. In this example, $t_3$ is about 3 mm, $t_4$ is about 4 mm and $t_5$ is about 31 mm.

The final structure is preferably substantially nonporous, regardless of whether the HIP procedure is used. Because the two-layer structure is formed as a green body, the sintering process results in substantively nonporous layers in the case of all layers, i.e. the alumina, the YAG and the yttria. The porosity of any of the layers is preferably significantly less than the porosity of a thermal sprayed yttria coating which can be about 5% or more. Preferably, each layer has a porosity of less than about 3% and more preferably less than about 1%.

Since high purity alumina and yttria have similar thermal expansion coefficients as well as similar shrinkage rates, the sintering process will not introduce stresses to the structure which may cause warping or other undesirable manufacturing artifacts. The co-sintered window can minimize contaminating particles during plasma etch manufacturing processes, and provide good mechanical properties, have very low porosity, and have improved resistance to peeling compared to thermally sprayed yttria coatings. The lifetime of the component in a plasma environment can exceed that of thermally sprayed yttria-coated ceramic components. Shrinkage, which occurs naturally during the sintering process can reduce the thickness of the sintered composite window.

Figure 3:
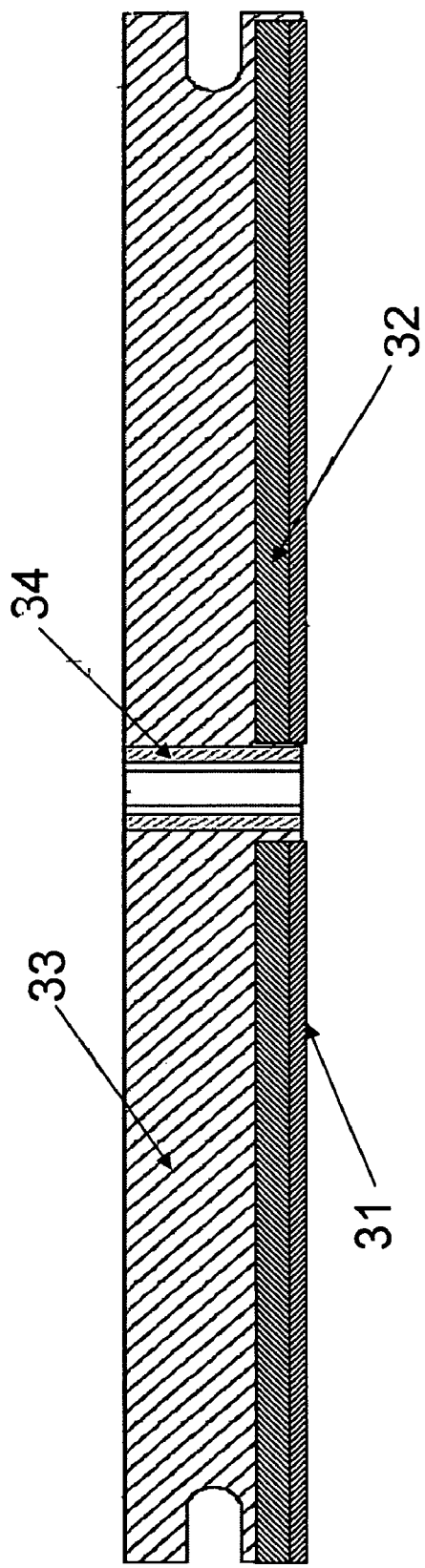
FIG. 3 shows a schematic configuration of a co-sintered TCP window.

The component can be, for example, a dielectric window, a chamber wall, a chamber liner, a substrate support, a gas distribution plate, a plasma confinement ring, a nozzle, a plasma focus ring, a hot edge ring or a coupling ring, each of which can be used in a plasma processing apparatus. An example of a dielectric window manufactured according to a preferred embodiment is shown schematically in FIG. 3. The dielectric window comprises an outer yttria layer 31, an intermediate YAG layer 32 and an alumina layer 33. The window is shown in the same orientation as window 107 in FIG. 1, i.e. as it would normally be used in an etch chamber, alumina surface 31 facing downward, toward the chamber interior. Gas injector 34 can also be seen.

According to another embodiment, components comprising a sealant applied to seal the porosity of a plasma spray or thermal spray yttria coating also provide superior protection against peeling of the yttria protective layer.

In a preferred embodiment, the application of a liquid sealant to the surface of an yttria coating serves to eliminate paths through the yttria which allow for the transport of HCl. The HCl, formed as a result of the reaction between aluminum chloride and water, is then prevented from penetration of the yttria layer through the pores, and reaching either the yttria/anodization layer interface in the case of an anodized substrate, or the yttria/ceramic interface in the case of a ceramic substrate. In the case of an anodized aluminum substrate, HCl is prevented from reaching the aluminum through micro-cracks in the anodized layer.

An exemplary sealant is HL 126™ (Permabond, Somerset, N.J.). HL126™ sealant is a low viscosity anaerobic sealant containing Tetraethylene glycol dimethacrylate, 2-Hydroxyethyl methacrylate, Saccharin, Cumene hydroperoxide, and Methacrylic acid. It can penetrate very small holes and cures under vacuum. Properties of the uncured adhesive include a liquid with a viscosity at 25° C. of 20 cP, comparable to that of water. The adhesive can reportedly fill gaps of a size down to 5 mils.

The HL 126™ sealant cures to a crosslinked, thermoset plastic, and has been found to have high plasma resistance under $Cl_2/BCl_3$ etch gas chemistry even with low flow of passivation gasses such as $CF_4$ and $CHF_3$ in the process recipe. The cured sealant preferably substantially seals the pores and extends the lifetime of plasma spray coated parts including yttria spray-coated parts, in metal etch applications.

An exemplary procedure of applying a sealant to an yttria coating, starting with the application of the ytrria is as follows: The morphology and cleanliness of the substrate is prepared before the yttria coating, and comprises bead blasting to roughen the target surface. The target surface could be the anodization layer of an anodized material like aluminum, or the ceramic surface of a ceramic material. The target surface is then coated with a plasma or thermal spray coating. After coating, the part is cleaned and baked. The liquid sealant is then applied to seal the voids, pores, micro-fractures and regions of incomplete bonding within the yttria coating layer. The sealant is brushed on with a clean nylon paint brush and all surfaces are wetted with the brushing action. After sealant application, a final precision wet cleaning is carried out. An oven is then prepared by heating to a desired temperature, evacuating the oven from atmospheric air, and introducing an $N_2$ purge. The substrate is then cured in the oven for 2 hours at 150° C.

After the cure, a second sealant coat is applied in the same way as the first coat, and another cure cycle is carried out under the same conditions as the first cure cycle. Finally, the part is subject to final inspection and final packaging. After a second cure cycle, the plasma spray coated yttria is preferably resistant to chemical attack, in particular to attack by HCl. Increased immunity to HCl attack at the coating/substrate interface preferably results in reduced peeling of the yttria layer. The improvement in performance seen with the use of two coats of liquid sealant is demonstrated in the following example:

EXAMPLE 2

Alumina windows with standard yttria coatings and different sealant histories were subject to immersion in a 5 wt % HCl solution for over 3 hours at room temperature. After immersion, the windows were visually inspected for evidence of corrosive attack. A first sample, a window without sealant, inspected after HCl solution immersion showed almost complete dissolution of the yttria coating. A second sample, a window with a single coat of sealant applied according to a procedure similar to the type described above, showed a color change in the coating to a milky white, indicating water uptake, but showed no signs of peeling. A third sample, in which a double coat of sealant was applied according to the procedure described above, showed no local color change and no peeling or corrosion.

A preferred sealant maintains its ability to act as a barrier by eliminating paths through the yttria which allow for the transport of corrosive agents during the course of normal usage of the plasma system. Oxygen plasmas are commonly used during the course of plasma processing to maintain chamber cleanliness and promote chamber performance consistency. Exposure to oxygen plasma can remove sealant from yttria surfaces. One measure of the durability of sealed surfaces is therefore the integrity of the sealant after exposure to oxygen plasma. One measure of the integrity of sealant properties is the electrical resistance of a sealed surface. By themselves, preferred sealants are electrically insulating. For example, HL-126 has a reported resistivity of $10^{17}$ Ohm-m, similar to that of fused quartz. By measuring the electrical resistance of a sealed yttria surface, a measure of the sealing properties of the sealant can be determined.

Figure 4:
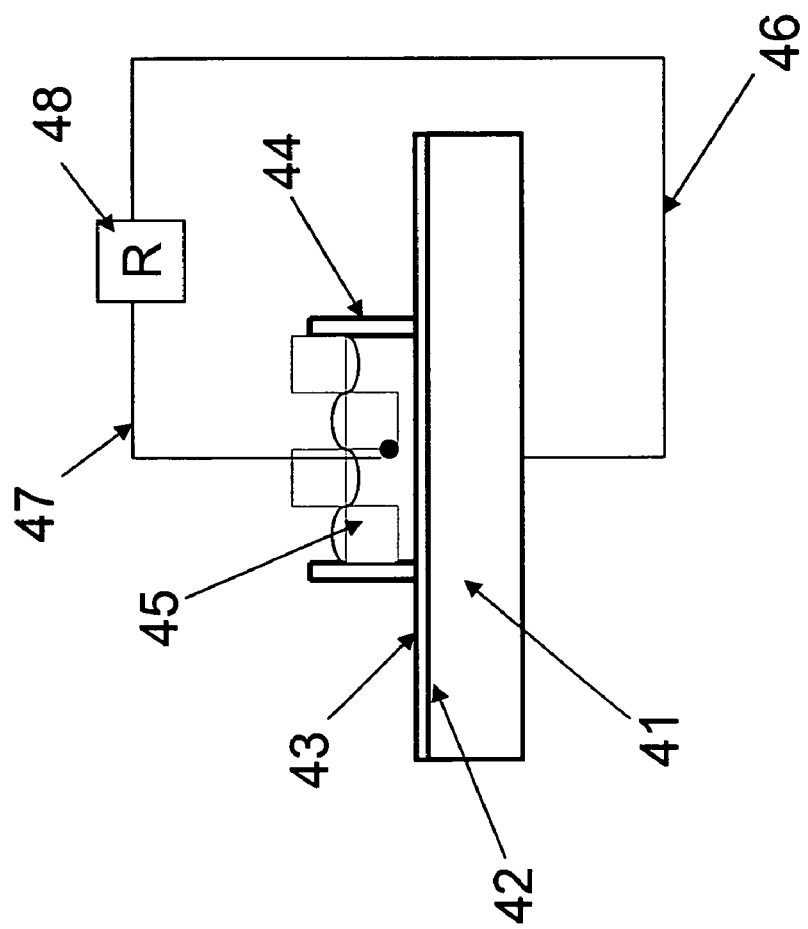
FIG. 4 shows a schematic configuration of an electrical test apparatus which includes the exposure of the yttria surface to a dilute HCl solution.

In order to test sealant integrity, yttria-coated aluminum coupons were exposed to an oxygen plasma environment for various times, whereupon they were subsequently subjected to a test for electrical resistance which included the exposure of the yttria surface to a dilute HCl solution. The electrical test apparatus is shown schematically in FIG. 4. An exemplary coupon comprising an aluminum base 41 and an yttria plasma spray coating 42 was maintained with the yttria-coated surface 43 facing upward. A containment wall 44 was mounted onto the upper yttria-coated surface 43, configured such that a dilute HCl solution 45 could be contained within the containment wall 44. One lead 46 was conductively attached to the aluminum base 41 of the coupon and the other 47 was immersed in the conductive solution 45. Resistance between the two leads was measured as a function of time using ohmmeter 48.

The resistance of the yttria is expected to be a function of the yttria area exposed to solution. Analogous to a conductive wire, the greater the cross-sectional area exposed to solution, the lower the resistance. The measured resistance is thus hypothesized to be a function of the standard equation relating resistance and resistivity:

$$R=\rho L/A, \tag{3}$$

Where R is resistance, $\rho$ is resistivity, L is length and A is area. The electrical test apparatus is arranged to measure resistance, which, when multiplied by the exposed area (RA), is expected to represent a product of the material properties, $\rho L$. In the case of this electrical test apparatus, the exposed area is the area of the liquid inside containment wall 44. Thus a plot of the product of measured resistance and exposed area as a function of HCl etch time is expected to represent a plot of resistivity and length vs. time.

Figure 5:
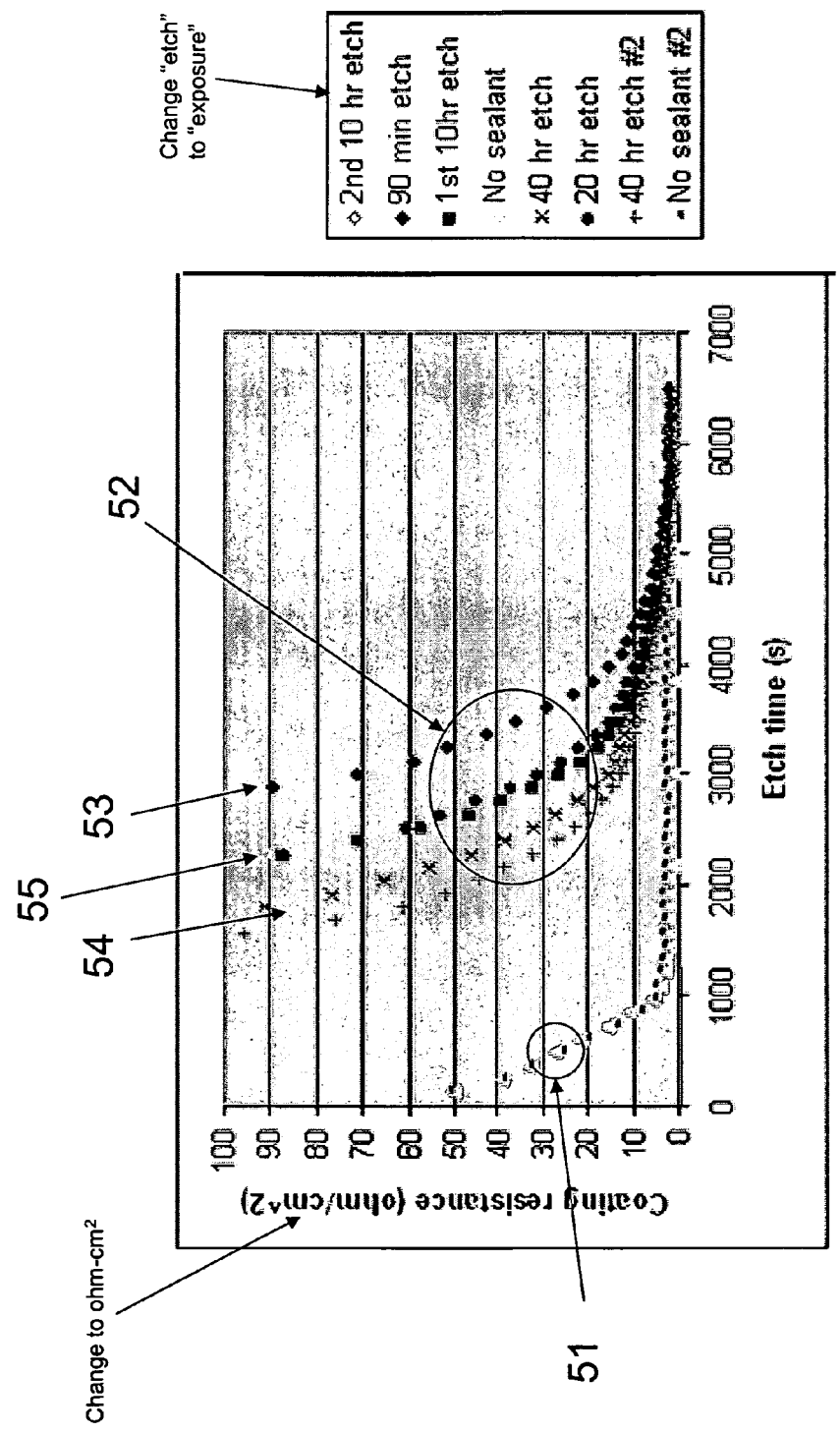
FIG. 5 shows a graph of the product of measured resistance and exposed area as a function of HCl etch time for several yttria-coated aluminum coupons.

Such a plot for each of the various coupons is shown in FIG. 5. The graph shows the measurements of a total of eight coupons, in which one curve is associated with each coupon. Of the eight measurements, two 51 are from coupons that do not have sealant, and six 52 are from coupons that have sealant on the yttria surface. The legend shown in FIG. 5 indicates the extent of exposure to oxygen plasma received by each coupon prior to the electrical test. For example, the coupon whose RA vs. time data is indicated by solid diamonds 53, received 90 minutes of exposure to oxygen plasma prior to resistance testing in HCl. The coupons whose data is indicated by the solid triangles, squares and circles which primarily overlap 55, received 10-20 hours of oxygen plasma exposure, and the coupons whose RA vs. time data are indicated by crosses and x's 54, received 40 hours of exposure to oxygen plasma prior to resistance testing in HCl. It can be seen that in general, greater exposure of the coupons to an oxygen plasma prior to resistance testing in HCl resulted in a lower RA of the coupon. For example, coupons exposed to 40 hours of plasma reduced the time required to reach the same RA product as coupons exposed for 90 minutes by about 1,200 seconds.

It can further be seen from FIG. 5 that RA of the unsealed coupons 51 starts lower and falls earlier than RA for the sealed coupons. After about 20 minutes (1,200 seconds) of exposure to the HCl solution, RA of the unsealed coupons is close to zero. Throughout the duration of all electrical tests but prior to the reduction of coating resistance to near zero, the coated coupons maintain an RA of at least ten times the RA of the uncoated coupons. Even after 40 hours of exposure to oxygen plasma, the coupons with sealant showed an RA of greater than ten times the RA of the coupons without sealant (solid triangle and dash) 51, even though neither coupon without sealant was exposed to oxygen plasma.

Without wishing to be bound by theory, the data suggests that sealant penetrates the open volume within the yttria coating deeply. The yttria is known to etch in the presence of dilute HCl. The decrease of the resistance to near zero implies that the yttria has been completely etched away, leaving aluminum in direct contact with the conductive HCl solution. It can be seen from FIG. 5 that the slope of RA for the coated and uncoated coupons with respect to time is comparable. Since the yttria coating is providing the primary resistance in the circuit of FIG. 4, evidence of comparable slopes implies comparable etch rates of the two films. As the yttria decreases in thickness, RA, because of its expected equivalence to $\rho L$, will decrease proportionally. This is consistent with the apparent linear decrease in measured resistance, assuming etch rate can reasonably be assumed to be constant.

The resistance curves are also consistent with deep penetration of the coating into the yttria layer. The reduction of the observed RA corresponding to a greater exposure of the coupons to an oxygen plasma prior to resistance testing in HCl suggests that continued exposure to an oxygen plasma continues to remove sealant from the yttria open areas. Evidently, removal of sealant from the complex yttria surface results in the revealing of more sealant underneath. The greater the exposure of the sealed layer to the oxygen plasma, the more sealant is removed, and the lower the resistivity of the layer. Furthermore, the RA curves of the sealed coupons show an apparently gradual change in slope throughout. If the sealant were not to penetrate the entire yttria layer, a sudden change in the slope might be expected as the added resistivity attributable to the presence of the sealant were eliminated before the entire yttria layer were etched away. The shape of the RA curves therefore suggests that the sealant effectively penetrates through the entire yttria layer, to the yttria/Al interface.

It is further expected that sealant lifetime under normal usage will be greater than the data in FIG. 5 may suggest, as a polymeric deposit is normally expected on interior chamber surfaces during use. Since oxygen plasma also reacts with this polymeric deposit, the expected effect of the presence of the polymeric deposit is to decrease exposure of the sealant to the plasma.

In a preferred embodiment, use of the sealant results in little or no process shift, i.e. no difference between the process success metrics for the case of using the sealant verses not using the sealant is detectable. Several exemplary process metric tests are provided. In one such test, a semiconductor wafer with an oxide layer on the upper surface was etched in a plasma processing chamber for a case in which the RF dielectric widow in the chamber was sealed with a sealant of the type discussed above, and again for a case in which the window was not sealed. Dielectric etch rate data from the two cases was measured. A final thickness of 555 Å of dielectric remaining after etch was achieved with a 3σ thickness variation of 31.0% in which the process was carried out in a chamber with an unsealed window, compared to a final thickness of 521 Å of dielectric remaining with a 3σ thickness variation of 31.8% in which the process was carried out in a chamber with a sealed window. In a photoresist etch comparison, a final thickness of 2049 Å of photoresist remaining after ash was achieved with a 3σ thickness variation of 10.6% in which the process was carried out in a chamber with a sealed window, compared to a final thickness of 2030 Å of photoresist remaining after ash with a 3σ thickness variation of 10.9%, in which the process was carried out in a chamber with a sealed window. These results suggest that a process shift directly attributable to the sealant alone as the source of the shift did not occur.

The introduction of impurities into the process due to the presence of the sealant in the chamber is also not expected. Impurity concentration in HL-126 was carried out using Inductively coupled plasma mass spectrometry (ICP-MS). Measured impurities in HL-126 can be found in the following table.

TABLE 1

| Element | Sealant (ppm) |
|---|---|
| Iron (Fe) | 0.017 |
| Calcium | 0.060 |
| Copper (Cu) | 0.018 |
| Chromium (Cr) | 0.048 |
| Cobalt (Co) | <0.001 |
| Magnesium (Mg) | 0.054 |
| Molybdenum (Mo) | <0.005 |
| Nickel (Ni) | 0.007 |
| Potassium (K) | 0.051 |
| Sodium (Na) | 57.0 |
| Tin (Sn) | 70.0 |
| Titanium (Ti) | 80.0 |
| Zinc (Zn) | 0.23 |

This level of impurities is not expected to lead to detectable levels of impurities on a wafer or substrate undergoing a plasma process in a chamber comprising sealed components, suggesting that a process shift directly attributable to the sealant alone as the source of the shift would not occur.

Another process success metric is a measure of the extent of particle generation. The introduction of particles as a result of using of a component with sealant in the plasma chamber was monitored by use of a process recipe designed to compare particles generated during plasma processes. The particle recipe includes the use of process gasses $Cl_2$, HBr and $N_2$, and a chuck temperature of 45° C., applied to a bare silicon wafer for a duration of 20 seconds. Particle adders due to the process were determined by measuring particle counts on the wafer before and after processing using a Tencor SP-1 unpatterned surface particle monitoring tool (KLA-Tencor, San Jose, Calif.) at a detectability limit of 0.12 μm.

The process was run in a plasma processing chamber for the case in which the RF dielectric widow in the chamber was sealed with a sealant of the type discussed above, and again for the case in which the window was not sealed. For the case of a standard window, the number of particle adders was measured to be 35, and for the case of the sealed window, the number of adders was 48. This measured difference in adders was not considered significant, and thus provided evidence to support the contention of equivalent process performance between the two cases. These results suggest that a process shift directly attributable to the sealant alone as the source of the shift did not occur.

While the invention has been described in detail with reference to specific embodiments thereof, it will be apparent to those skilled in the art that various changes and modifications can be made, and equivalents employed, without departing from the scope of the appended claims

What is claimed is:

1. A method of making a three-layer component of a plasma processing chamber comprising:
   a. forming a dual-layer green body by
      i. pressing together a first layer and a second layer by applying an external pressure against the first and second layers; and
      ii. machining the pressed together layers to desired dimensions;
   wherein the first layer comprises a green sheet of alumina particles and a polymeric binder, and the second layer comprises a green sheet of yttria particles and a polymeric binder; and
   b. co-sintering the dual-layer green body, wherein the first layer and the second layer are in intimate contact during the sintering process; so as to form a three-layer component, comprising an outer layer of alumina having a thickness of from about 15 mm to about 45 mm adjacent an intermediate layer comprising a solid solution of yttria and alumina, adjacent a second outer layer of yttria.

2. The method of claim 1, wherein the intermediate layer consists of YAG, the first layer consists of a green sheet of alumina and the polymeric binder, and the second layer consists of a green sheet of yttria and the polymeric binder.

3. The method of claim 1, wherein the porosity of any of the outer layer of yttria, the intermediate layer, and the outer layer of alumina is less than 3%.

4. The method of claim 1, wherein the porosity of any of the outer layer of yttria, the intermediate layer, and the outer layer of alumina is less than 1%.

5. The method of claim 1, wherein the first layer and second layer are hot isostatically pressed together during the co-sintering process.

6. The method of claim 1, wherein the first layer and the second layer of the green body are disk-shaped, with a diameter of at least the desired final diameter, and wherein the green body consists essentially of the first and second layers.

7. The method of claim 1, wherein the three layer component forms a dielectric RF transmitting window.

8. The method of claim 7, wherein the first layer of the green body has a thickness of from about 20 mm to about 40 mm, and the second layer of the green body has a thickness of from about 1 mm to about 9 mm.

9. The method of claim 7, wherein the outer layer of yttria of the three-layer component has a thickness of from about 1 mm to about 5 mm, the intermediate layer of the three-layer component has a thickness of from about 2 mm to about 6 mm, and the outer layer of alumina of the three-layer component has a thickness of from about 15 mm to about 45 mm.

10. The method of claim 1, wherein the three-layer component is selected from the group consisting of a chamber wall, a chamber liner, a baffle, a gas distribution plate, a plasma confinement ring, a nozzle, a plasma focus ring, a hot edge ring, a coupling ring, and a fastener element of a plasma processing apparatus.

11. The method of claim 1, wherein the three-layer component consists of the outer layer of alumina, the intermediate layer and the second outer layer of yttria.

* * * * *